United States Patent
Classen et al.

(10) Patent No.: US 8,952,466 B2
(45) Date of Patent: Feb. 10, 2015

(54) FLEXIBLE STOP FOR AN ACCELERATION SENSOR

(71) Applicants: Johannes Classen, Reutlingen (CZ); Jochen Reinmuth, Reutlingen (DE); Guenther-Nino-Carlo Ullrich, Reutlingen (DE)

(72) Inventors: Johannes Classen, Reutlingen (CZ); Jochen Reinmuth, Reutlingen (DE); Guenther-Nino-Carlo Ullrich, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 91 days.

(21) Appl. No.: 13/889,814

(22) Filed: May 8, 2013

(65) Prior Publication Data

US 2013/0299923 A1   Nov. 14, 2013

(30) Foreign Application Priority Data

May 11, 2012   (DE) .......................... 10 2012 207 939

(51) Int. Cl.
 *B81B 3/00* (2006.01)
 *G01P 15/08* (2006.01)
(52) U.S. Cl.
 CPC ............. *B81B 3/0018* (2013.01); *B81B 3/0051* (2013.01); *B81B 2201/0235* (2013.01); *G01P 2015/0871* (2013.01)
 USPC .......................................................... 257/415
(58) Field of Classification Search
 USPC .......................................................... 257/415
 See application file for complete search history.

(56) References Cited

U.S. PATENT DOCUMENTS

| | | | | | |
|---|---|---|---|---|---|
| 4,676,103 | A | * | 6/1987 | Nakajima | ................... 73/514.09 |
| 5,824,901 | A | * | 10/1998 | van Seeters | ................ 73/514.32 |
| 6,644,117 | B1 | * | 11/2003 | Kueck et al. | ..................... 73/488 |
| 6,958,614 | B2 | * | 10/2005 | Morimoto | ..................... 324/661 |
| 2003/0150269 | A1 | * | 8/2003 | Saitoh | ........................ 73/514.33 |
| 2004/0104735 | A1 | * | 6/2004 | Morimoto | ..................... 324/660 |

FOREIGN PATENT DOCUMENTS

| | | |
|---|---|---|
| DE | 10 2008 043 753 | 5/2010 |
| EP | 0 773 443 | 9/1996 |
| EP | 0 244 581 | 5/1997 |
| EP | 216 88 09 | 3/2010 |

* cited by examiner

*Primary Examiner* — Thao P Le
(74) *Attorney, Agent, or Firm* — Kenyon & Kenyon LLP

(57) ABSTRACT

A micromechanical acceleration sensor includes a seismic mass and a substrate that has a reference electrode. The seismic mass is deflectable in a direction perpendicular to the reference electrode, and the seismic mass has a flexible stop in the deflection direction. The flexible stop of the seismic mass includes an elastic layer.

11 Claims, 5 Drawing Sheets

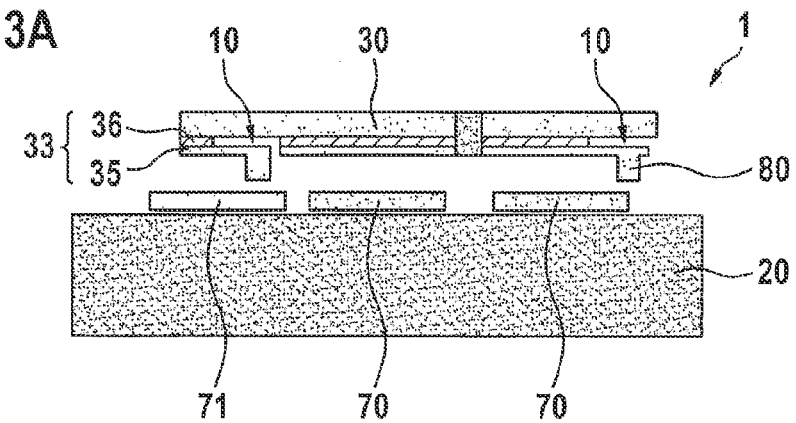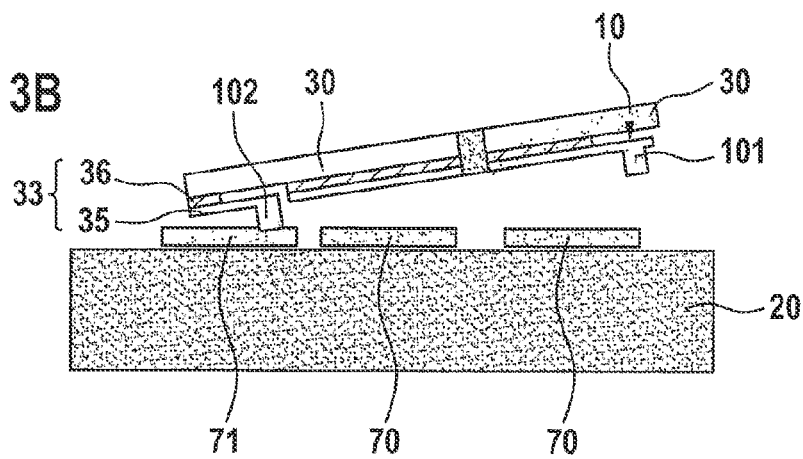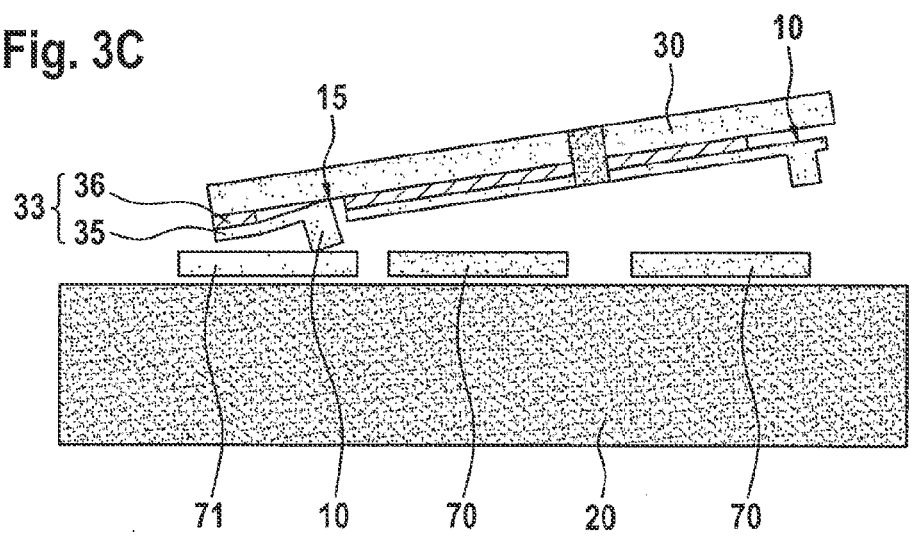

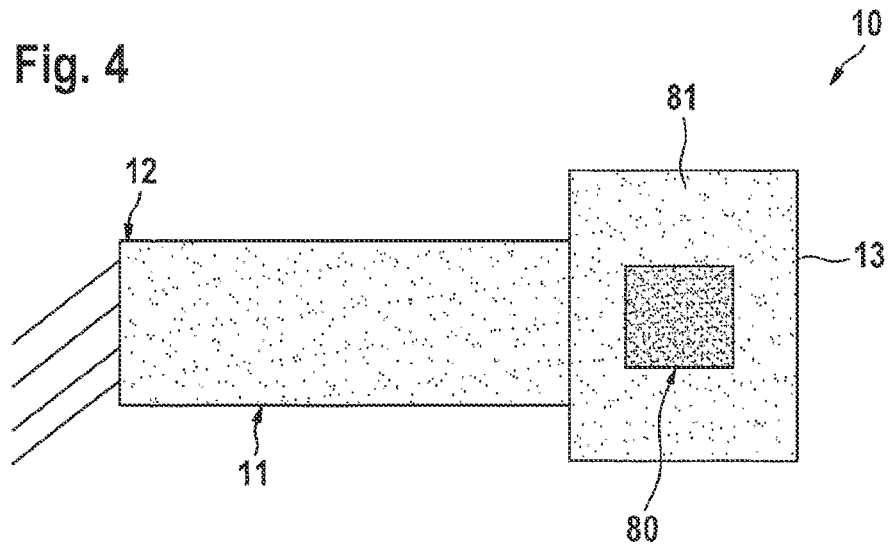
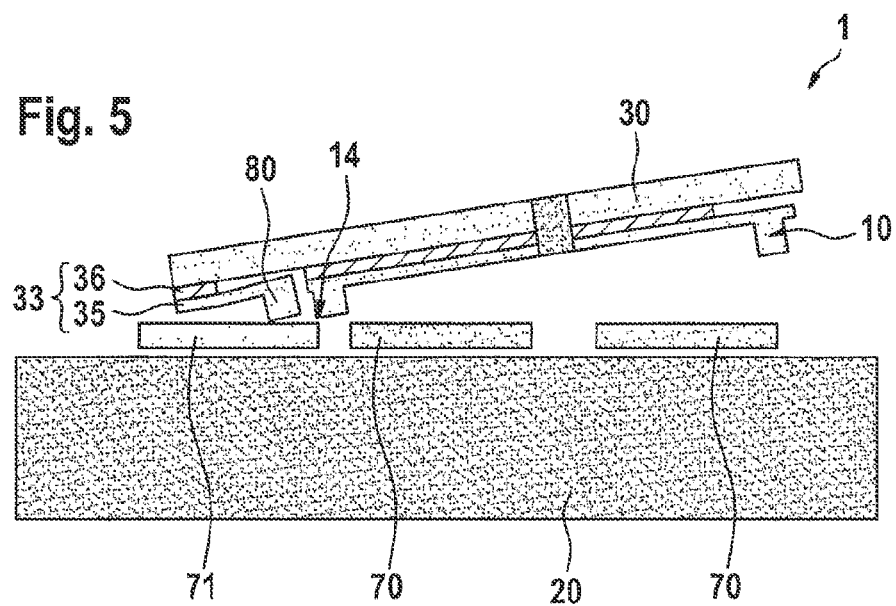

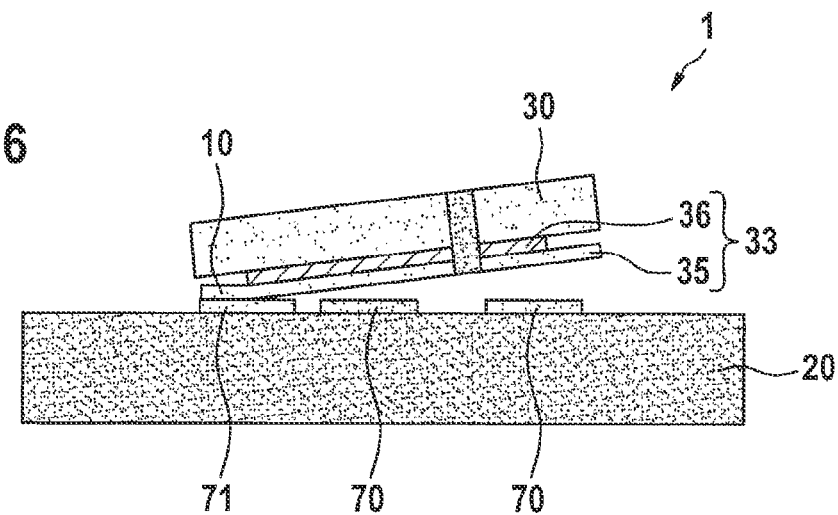
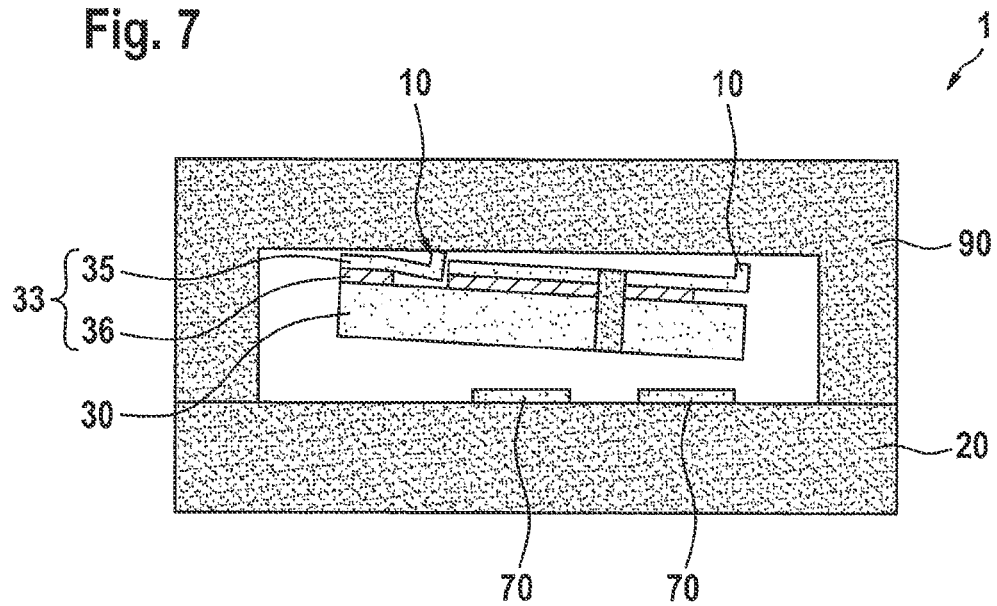

FLEXIBLE STOP FOR AN ACCELERATION SENSOR

BACKGROUND OF THE INVENTION

1. Field of the Invention

The present invention relates to a micromechanical acceleration sensor having a substrate that has a reference electrode, and a seismic mass deflectable in a direction perpendicular to the substrate, a flexible stop being provided to limit the movement of the seismic mass.

2. Description of the Related Art

Modern sensors for measuring physical acceleration usually have a micromechanical structure made of silicon, also known as sensor core, and evaluation electronics. Sensor cores, which make it possible to measure an acceleration in a direction orthogonal to a main plane of the sensor core, are known as Z-sensors. Such sensors are used in the automotive sector, e.g., in ESP systems or perhaps in the field of wireless telephony. The sensor principle indicated is disclosed, inter alia, in published European patent document EP 0 244 581, which describes a micromechanical sensor for the automatic triggering of occupant-safety devices, and in published European patent document EP 0 773 443 B1, which shows a micromechanical acceleration sensor.

Typically, a micromechanical acceleration sensor includes a seismic mass deflectable in the Z-direction relative to a substrate, the seismic mass being joined to the substrate via a spring element. The maximum deflection of the seismic mass is limited by a stop device on the substrate. In the case of a stop of the seismic mass on rigid structures of the sensor, high force peaks may occur which must be processed by the micromechanical structure. This could result in mechanical damage to the structure.

Furthermore, because of the very small dimensions and spacings of the micromechanical structures, upon contact, the inter-atomic attractive forces may gain in importance as against the restoring force of the spring element to such an extent that the structure remains stuck in the limit-stop state. In order to minimize these disadvantageous effects, attempt has been made to construct the stop as a flexible stop via a relatively yielding, resilient connection.

Such a flexible stop in the Z-direction is already the subject matter of published European patent application document EP 2168809 A1 and published German patent application document DE 10 2008 043 753 A1. These designs have the disadvantage that the structures they propose have a relatively high space requirement, since the stop springs are realized in the thick functional layer of the micro-electro-mechanical system (MEMS) which has thicknesses greater than 10 μm, typically 15 μm to 20 μm. The great stiffness thereby caused must be offset by a correspondingly great length of the stop springs. This, in turn, is at the expense of precious space in the sensor core.

BRIEF SUMMARY OF THE INVENTION

The present invention therefore has the objective of providing an improved acceleration sensor in which the flexible stops have a compact type of construction, so that the size of the sensor core is able to be kept small.

According to a first aspect of the present invention, the micromechanical acceleration sensor includes a seismic mass and a substrate which has a reference electrode, the seismic mass being deflectable in a direction perpendicular to the reference electrode, and the seismic mass having a flexible stop in the deflection direction, the flexible stop of the seismic mass including an elastic layer.

Producing the flexible stop by using an elastic layer is not limited by the stiffness of a thick MEMS functional layer, from which the seismic mass is constructed. This has the advantage that the flexible stop is able to be compact. This, in turn, saves on valuable space in the sensor core and leads overall, therefore, to a more compact formation of the acceleration sensor.

According to one preferred embodiment of the invention, the seismic mass and the flexible stop constitute a first and a second functional layer in their vertical construction, the layer thickness of the first functional layer being greater than the thickness of the second functional layer, and the flexible stop being formed within the second functional layer. This has the advantage that the flexible stop may be integrated easily owing to the layered construction of the seismic mass, because the individual functional layers are able to be patterned independently of each other. In particular, the flexible stop may easily be integrated in various formations of the seismic mass, so that existing sensor systems are able to be expanded by the flexible stop in especially cost-effective manner, in order to prevent the "sticking."

According to a further preferred specific embodiment, a further layer is disposed between the first functional layer and the second functional layer, the further layer being patterned in order to form a flexible stop in the form of a free-standing, elastic section in the case of the second functional layer. It is especially advantageous that by removing the further layer below the flexible stop, a free-standing, flexible structure is able to be formed that is very compact in terms of required space.

It is further preferred that the free-standing section of the flexible stop has the form of a flexible arm, which at one end, is joined firmly to the seismic mass, and at its other end, is movable. The advantage of this form is that it possesses a simple compact geometry able to be produced inexpensively using conventional means of patterning, and has a small space requirement. Furthermore, the flexible arm of the stop is able to be oriented in various directions within the functional layer. Preferably, the flexible arm is oriented inwardly with the movable end, toward the torsion axis of the deflectable seismic mass, or outwardly in the opposite direction. The possibility of the different orientation has the advantage that the flexible stop is able to be adapted very well to the geometry of conventional acceleration sensors.

According to one preferred development, a projection, also known as a nub, is applied on the flexible stop, the projection being provided on the elastic layer so as to protrude essentially in the deflection direction. This development makes it possible to keep the contact surface small in the limit-stop state. This reduces the danger of the seismic mass "remaining stuck." Moreover, it is advantageous that by applying the projection, a special material having good antistick properties may be selected, thereby further reducing the danger of "remaining stuck."

According to one preferred further refinement, a further projection is applied on the second functional layer adjacent to the flexible stop, the further projection protruding essentially in the deflection direction, and the deflection of the flexible stop and of the seismic mass being limited by the further projection, which represents a rigid stop. The advantage of this specific embodiment is that, due to the presence of the rigid stop, the flexible stop is deflected only up to a certain point. Possible overstressing of the elasticity of the flexible stop owing to too strong a deflection is thereby prevented. Nevertheless, the restoring force of the flexible stop generated by the limited deflection brings about a decrease in the danger of the seismic mass "remaining stuck."

According to one preferred development, the seismic mass takes the form of a rocker which has a first and a second crossbar, is deflectable about a torsion axis relative to the substrate, and is joined to the substrate via a spring element, the two crossbars of the rocker having different masses. Optionally, at least one flexible stop may be formed on each of the two crossbars of the rocker. This specific embodiment has the special advantage that a flexible stop limits the deflection of the rocker in both deflection directions of the rocker. The probability of the rocker, and therefore the seismic mass, "remaining stuck" is thereby reduced in both deflection directions.

According to the invention, it is further preferred that the flexible stop is formed on the side of the seismic mass facing away from the substrate. This has the advantage that the reference electrode and the flexible stop are disposed on different sides of the seismic mass, that is, are spatially decoupled from each other. Special forms of acceleration sensors may thereby be realized, without the flexible stop and reference electrodes mutually obstructing each other in their spatial configuration.

BRIEF DESCRIPTION OF THE DRAWINGS

FIGS. 3A-3C each show a lateral view of an acceleration sensor according to a further specific embodiment, FIG. 3A showing the normal operation, FIG. 3B showing operation at overstress, and FIG. 3C showing operation at overstress with maximum deflection of the seismic mass.

FIG. 4 shows a schematic top view of a flexible stop in the form of an arm.

FIG. 5 shows a lateral view of a micromechanical acceleration sensor according to a further specific embodiment in operation at overstress with maximum deflection of the seismic mass.

FIG. 6 shows a lateral view of an acceleration sensor according to another specific embodiment having a flexible stop without a stop nub.

FIG. 7 shows a lateral view of an acceleration sensor of an alternative specific embodiment, the z-stop taking place not on the substrate, but rather on the cap of the sensor.

DETAILED DESCRIPTION OF THE INVENTION

Figure 1A:
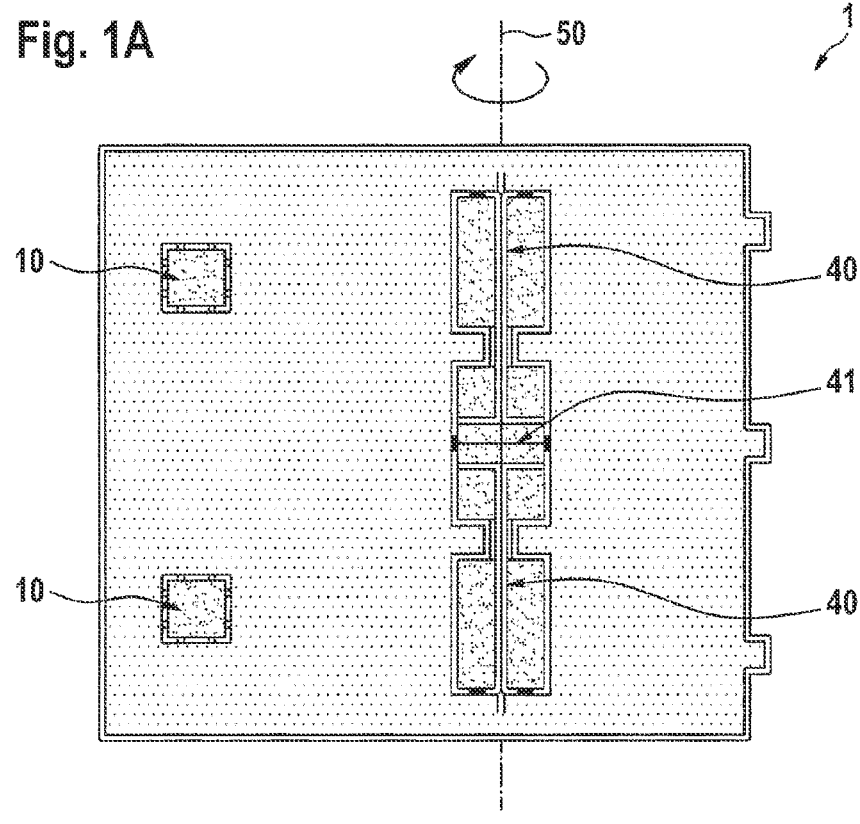
FIGS. 1A and 1B show a schematic top view and lateral view, respectively, of a micromechanical acceleration sensor according to a first specific embodiment.
Figure 1B:
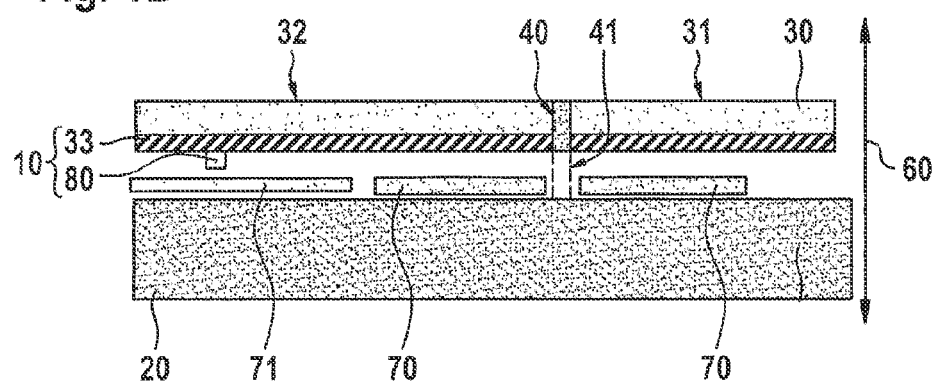

FIG. 1A and FIG. 1B show a first specific embodiment of a sensor system 1 in a schematic top view and a schematic lateral view. Sensor system 1 includes a substrate 20 and a seismic mass 30, seismic mass 30 taking the form of a rocker, that is, seismic mass 30 being joined elastically to substrate 20 via a formation 41 with the aid of a torsion-spring system 40 disposed centrally in terms of the seismic mass, and being deflectable relative to substrate 20 about a torsion axis 50. Seismic mass 30 has a first crossbar 31 and a second crossbar 32 specific to torsion axis 50, second crossbar 32 being longer than first crossbar 31, an uneven mass distribution thereby ensuing in the case of seismic mass 30 relative to torsion axis 50.

As a result of the uneven mass distribution, in response to an acceleration of sensor system 1 in a direction perpendicular to substrate 20, i.e., parallel to z-direction 60 indicated in FIG. 1B, seismic mass 30 undergoes a moment of rotation about torsion axis 50 owing to its inertia, so that the distance between first crossbar 31 and substrate 20, as well as between second crossbar 32 and substrate 20 changes. This change in distance because of the deflection of seismic mass 30 is able to be measured capacitively with the aid of two electrodes 70, one of which is disposed flat on substrate 20 on each side of torsion-spring system 40. To that end, seismic mass 30 is maintained at a potential M by an electronic circuit (not shown). Opposing electrodes 70, flat-mounted on substrate 20, then form capacitances C1 and C2, respectively, with seismic mass 30, the capacitances being equal in the state of rest of sensor system 1.

The change in distance between seismic mass 30 and substrate 20 caused by the deflection of seismic mass 30 may be detected by a suitable evaluation of capacitances C1 and C2, and thus the acting acceleration is able to be determined.

Alternatively, it is also possible to form seismic mass 30 not as a rocker having two crossbars, but rather as an arm, for example, which is joined elastically at one end via a torsion-spring system to the substrate.

As shown in FIG. 1A, seismic mass 30 has mechanical stops 10 which, as illustrated in FIG. 1B, may be formed as projection 80, and in the case of very sharp acceleration, limit the deflection of seismic mass 30 by touching substrate 20. To that end, below the asymmetrical area of seismic mass 30, a further electrode 71 is mounted flat on substrate 20, is likewise maintained at potential M and is used as stop on the substrate side. On the side facing the substrate, seismic mass 30 has an elastic layer 33, on which projection 80 is applied. Elastic layer 33 may be applied in such a way that it completely or partially covers the surface area of the seismic mass facing the substrate. Elastic layer 33 and projection 80 together form flexible stop 10.

Figure 2A:
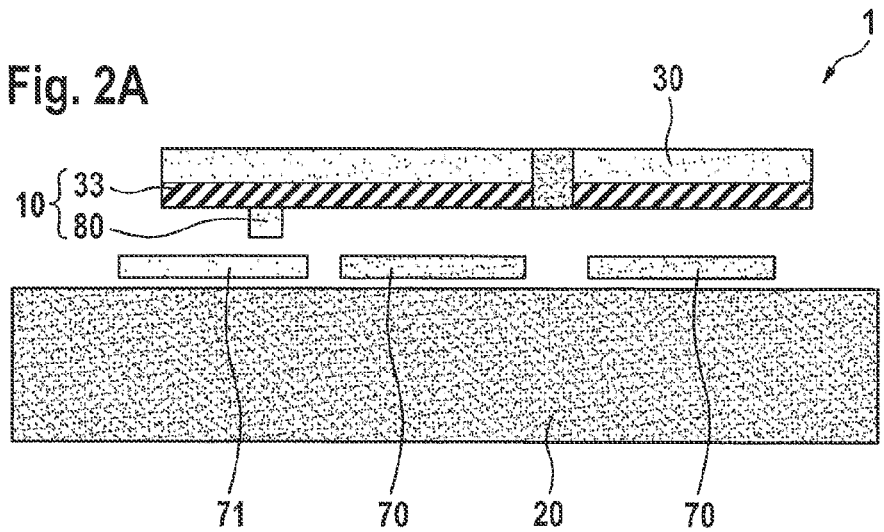
FIGS. 2A and 2B show a lateral view of the acceleration sensor according to the first specific embodiment in normal operation and in operation at overstress, respectively.
Figure 2B:
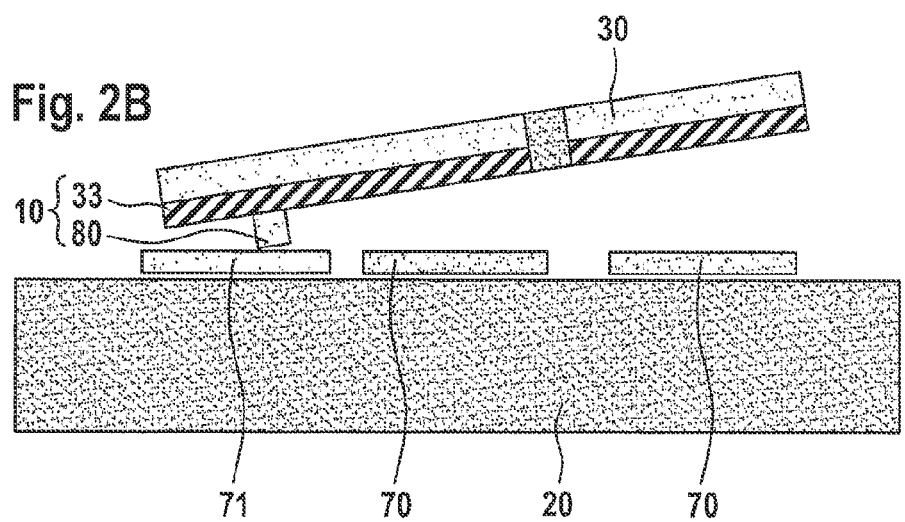

FIG. 2A and FIG. 2B show sensor system 1 in a schematic lateral view in the different operating modes. FIG. 2A shows the normal operation. Due to low z-acceleration, seismic mass 30 undergoes only a slight deflection, so that no mechanical contact comes about between seismic mass 30 and substrate 20. On the other hand, FIG. 2B shows the operation at overstress. Due to high z-acceleration, seismic mass 30 is deflected sharply, so that a mechanical contact comes about between seismic mass 30 and the surface of substrate 20 which limits the deflection. The mechanical contact between seismic mass 30 and substrate 20 takes place via flexible stop 10. Flexible stop 10 may be applied on one side of rocker 30, as shown in FIG. 1 and FIG. 2, or on both sides of the rocker, as well.

Upon contact of seismic mass 30 with substrate 20, as illustrated in FIG. 2B, there is the danger that seismic mass 30 will remain stuck on substrate 20. This may lead to a breakdown of sensor system 1, since seismic mass 30 is then no longer movable, and therefore acceleration is no longer able to be measured. The danger of "remaining stuck" during operation at overstress in FIG. 2B may be reduced by elastic layer 33 of flexible stop 10. This increases the robustness and reliability of sensor system 1.

FIGS. 3A through 3C show three schematic lateral views according to a further specific embodiment of the present invention in various operating modes. In this case, the design of sensor system 1 resembles the design described in connection with FIG. 1 and FIG. 2, elastic layer 33 being constructed from a plurality of superposed layers, however. FIG. 3A shows a layer construction of elastic layer 33 from two functional layers 35, 36, layer 36 applied below the seismic mass also being denoted as sacrificial layer. The functional layer of seismic mass 30 is thicker than functional layers 35, 36 of elastic layer 33, which exhibit springiness owing to their slight thickness. Seismic mass 30 as well as functional layer 35 and sacrificial layer 36 of elastic layer 33 may each be made of the same material, preferably silicon. However, different materials may also be used, for example, silicon for functional layer 35 and silicon oxide for sacrificial layer 36.

The various layers may now be patterned independently of each other using methods known from semiconductor technology, such as lithography, wet etching or dry etching, for example. Thus, flexible stops 10 are produced by patterning thin functional layer 35 and sacrificial layer 36. In the area of patterned, thin, functional layer 35, further layer 36 lying below has a cutout. Thus, flexible stop 10 is obtained because of the slight thickness and the elasticity of functional layer 35 thereby provided, and the free-standing structure produced by the cutout in further layer 36. Projections 80 acting as mechanical stops may be formed on this free-standing structure. Projections 80 may be produced by patterning layer 36. Due to the high elasticity of thin functional layer 35 and owing to the patterning possibilities given by the layer construction of seismic mass 30, very small flexible stops 10 may be produced which allow very compact structures of acceleration sensors 1.

In FIG. 3A, flexible stops 10 of this type are provided on both sides of torsion axis 50. However, it is also possible to use flexible stop 10 on only one crossbar of the rockers, and no stop or a rigid stop on the second crossbar. Furthermore, it is also possible to form seismic mass 30 not as a rocker, but rather as an arm (not depicted), which is joined elastically at one end to the substrate via a torsion-spring system.

While FIG. 3A shows sensor system 1 according to the further specific embodiment in normal operation, analogous to FIG. 2A, FIG. 3B and FIG. 3C show the operation at overstress. In this case, seismic mass 30 is sharply deflected by high z-acceleration, so that a mechanical contact comes about between seismic mass 30 and substrate 20. In the present case, the mechanical contact takes place via flexible stops 10 which are formed optionally as projections 80 on seismic mass 30 and which touch the substrate surface during operation at overstress, as shown in FIG. 3B. If the force which acts on the seismic mass owing to the acceleration of the sensor system is great enough, then flexible stop 10 is deflected by the contact with substrate 20 until with its backside, it comes into a contact 15 with seismic mass 30, and thus turns into a rigid stop, as illustrated in FIG. 3C.

One preferred form of flexible stop 10 is shown in a top view in FIG. 4. In this development, flexible stop 10, made of a part of thin functional layer 35, has the rectangular shape of a flexible arm 11 that, with one end 12, is joined firmly to the seismic mass, and at other end 13, is free-standing. Optionally, projection 80 as well as a widening 81 may be applied at this end 13, as shown in FIG. 4. However, flexible stop 10 may also be realized in other embodiments. Thus, for example, a triangular shape or a semicircular shape is possible. The free-standing elastic structures and therefore flexible stops 10 may have different orientation. Preferably, as shown in FIG. 3B, for example, they may be disposed perpendicular to torsion axis 50 with a first free end 101 pointing outward, or disposed with a second free end 102 pointing inward. The possibility of the different orientation has the advantage that the flexible stop is able to be adapted very well to the geometry of conventional acceleration sensors.

FIG. 5 shows a further specific embodiment for limiting the movement of flexible stop 10. This is accomplished by a combination of flexible stop 10 with a rigid stop 14, which are situated adjacent to each other on seismic mass 30. In operation at overstress, flexible stop 10 is again deflected by the contact with substrate 20. However, before its backside comes in contact with seismic mass 30 due to the increasing deflection, as described in FIG. 3C, in this case, adjacently located, rigid stop 14 also contacts substrate 20 and thus limits the deflection of flexible stop 10 and of seismic mass 30. The advantage of the specific embodiment shown in FIG. 5 is that flexible stop 10 is limited in its deflection owing to the presence of rigid stop 14. Possible overstressing of the elasticity of flexible stop 10 due to too strong a deflection is thereby prevented. Nevertheless, the limited deflection also reduces the occurrence of great force peaks upon contact of seismic mass 30 and substrate 20, and consequently a possible deformation or a state of "remaining stuck." The restoring force generated by the deflection of flexible stop 10 likewise reduces the danger of seismic mass 30 "remaining stuck."

A further preferred specific embodiment is illustrated in FIG. 6. Similar to FIG. 3C, a sensor system 1 having flexible stop 10 is again shown in operation at overstress, flexible stop 10 being made only of the free-standing patterned part of flexible, thin, functional layer 35, and no projections being applied on the flexible layer. Thus, during operation at overstress, flexible layer 35 contacts the surface of substrate 20 directly. The distance between seismic mass 30 and substrate 20 is therefore not reduced by the presence of a projection applied on flexible stop 10, which means a greater deflection of seismic mass 30 is made possible, and a greater range for the normal operation in the case of the acceleration measurement is thus obtained. The number of process steps and therefore costs are also reduced by the omission of the projections.

Another preferred specific embodiment is illustrated in FIG. 7. Similar to FIG. 3C, a sensor system 1 having flexible stop 10 according to the present invention is shown in operation at overstress, flexible stop 10 being formed on the side of seismic mass 30 facing away from substrate 20. This is achieved by reversing the sequence of functional layers from which seismic mass 30 and flexible stop 10 are constructed. In the present exemplary embodiment, as shown in FIG. 7, sensor system 1 is covered by a cap 90. Upon deflection of seismic mass 30, instead of contacting substrate 20, flexible stop 10 contacts the inside of cap 90. This has the advantage that reference electrodes 70 and flexible stop 10 are disposed on different sides of seismic mass 30, that is, are spatially decoupled from each other. In this manner, compact forms of acceleration sensors are able to be realized without flexible stop 10 and reference electrodes 70 mutually obstructing each other in their spatial configuration.

What is claimed is:

1. A micromechanical acceleration sensor, comprising:
    a seismic mass; and
    a substrate which has a reference electrode;
    wherein the seismic mass is deflectable in a direction perpendicular to the reference electrode, and wherein the seismic mass has a flexible stop in the deflection direction, and wherein the flexible stop of the seismic mass includes an elastic layer.

2. The micromechanical acceleration sensor as recited in claim 1, wherein the seismic mass and the flexible stop are formed as functional layers, and wherein a layer thickness of the functional layer of the seismic mass is greater than a layer thickness of the functional layer of the flexible stop.

3. The micromechanical acceleration sensor as recited in claim 2, wherein a further layer is disposed between the functional layer of the seismic mass and the functional layer of the flexible stop, the further layer being patterned in order to form the flexible stop in the form of a free-standing section.

4. The micromechanical acceleration sensor as recited in claim 3, wherein the flexible stop is configured as an arm having a first end which is joined firmly to the seismic mass and a second end which is movable.

5. The micromechanical acceleration sensor as recited in claim 4, wherein the flexible arm of the flexible stop points outward with the movable second end away from a torsion axis, and wherein the seismic mass is deflectable about the torsion axis.

6. The micromechanical acceleration sensor as recited in claim 4, wherein the flexible arm of the flexible stop points inward with the movable second end toward a torsion axis, and wherein the seismic mass is deflectable about the torsion axis.

7. The micromechanical acceleration sensor as recited in claim 4, wherein the flexible stop has a projection provided on the elastic layer and projecting essentially in the deflection direction.

8. The micromechanical acceleration sensor as recited in claim 4, wherein a rigid stop is applied on the functional layer adjacent to the flexible stop, the rigid stop projecting essentially in the deflection direction, and wherein deflections of the flexible stop and of the seismic mass are limited by the rigid stop.

9. The micromechanical acceleration sensor as recited in claim 4, wherein the seismic mass is (i) in the form of a rocker having a first crossbar and a second crossbar, and (ii) deflectable about a torsion axis relative to the substrate, and wherein the first and second crossbars of the rocker have different masses.

10. The micromechanical acceleration sensor as recited in claim 4, wherein the flexible stop is formed on the side of the seismic mass which is oriented toward the substrate.

11. The micromechanical acceleration sensor as recited in claim 4, wherein the flexible stop is formed on the side of the seismic mass facing away from the substrate.

* * * * *